(12) United States Patent
Chen et al.

(10) Patent No.: US 11,533,799 B1
(45) Date of Patent: Dec. 20, 2022

(54) SYSTEM AND METHOD FOR SUPPLYING TARGET MATERIAL IN AN EUV LIGHT SOURCE

(71) Applicant: TAIWAN SEMICONDUCTOR MANUFACTURING COMPANY LTD., Hsinchu (TW)

(72) Inventors: Hsin-Feng Chen, Yilan (TW); Ming-Hsun Tsai, Hsinchu (TW); Li-Jui Chen, Hsinchu (TW); Shang-Chieh Chien, New Taipei (TW); Heng-Hsin Liu, New Taipei (TW); Cheng-Hao Lai, Taichung (TW); Yu-Huan Chen, Hsinchu (TW); Wei-Shin Cheng, Hsinchu (TW); Yu-Kuang Sun, Hsinchu (TW); Cheng-Hsuan Wu, New Taipei (TW); Yu-Fa Lo, Kaohsiung (TW); Chiao-Hua Cheng, Tainan (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 5 days.

(21) Appl. No.: 17/372,294

(22) Filed: Jul. 9, 2021

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/005* (2013.01); *H05G 2/008* (2013.01)

(58) Field of Classification Search
CPC ........ H05G 2/006; H05G 2/005; H05G 2/008; G03F 7/70033
See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

*Primary Examiner* — Nicole M Ippolito
*Assistant Examiner* — Hanway Chang
(74) *Attorney, Agent, or Firm* — WPAT Law; Anthony King

(57) ABSTRACT

A system and a method for supplying target material in an EUV light source are provided. The system for supplying a target material comprises a priming assembly, a refill assembly and a droplet generator assembly. The priming is configured to transform the target material from a solid state to a liquid state. The refill assembly is in fluid communication with the priming assembly and configured to receive the target material in the liquid state from the priming assembly. Further, the refill assembly includes a purifier configured to purify the target material in the liquid state. The droplet generator assembly is configured to supply the target material in the liquid state from the refill assembly.

20 Claims, 5 Drawing Sheets

SYSTEM AND METHOD FOR SUPPLYING TARGET MATERIAL IN AN EUV LIGHT SOURCE

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material into a plasma state that has an element, for example, xenon, lithium, or tin, with an emission line in the EUV range. In one such method, often termed laser produced plasma ("LPP"), the required plasma can be produced by irradiating a target material, for example, in the form of a droplet, stream, or cluster of material, with an amplified light beam that can be referred to as a drive laser.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
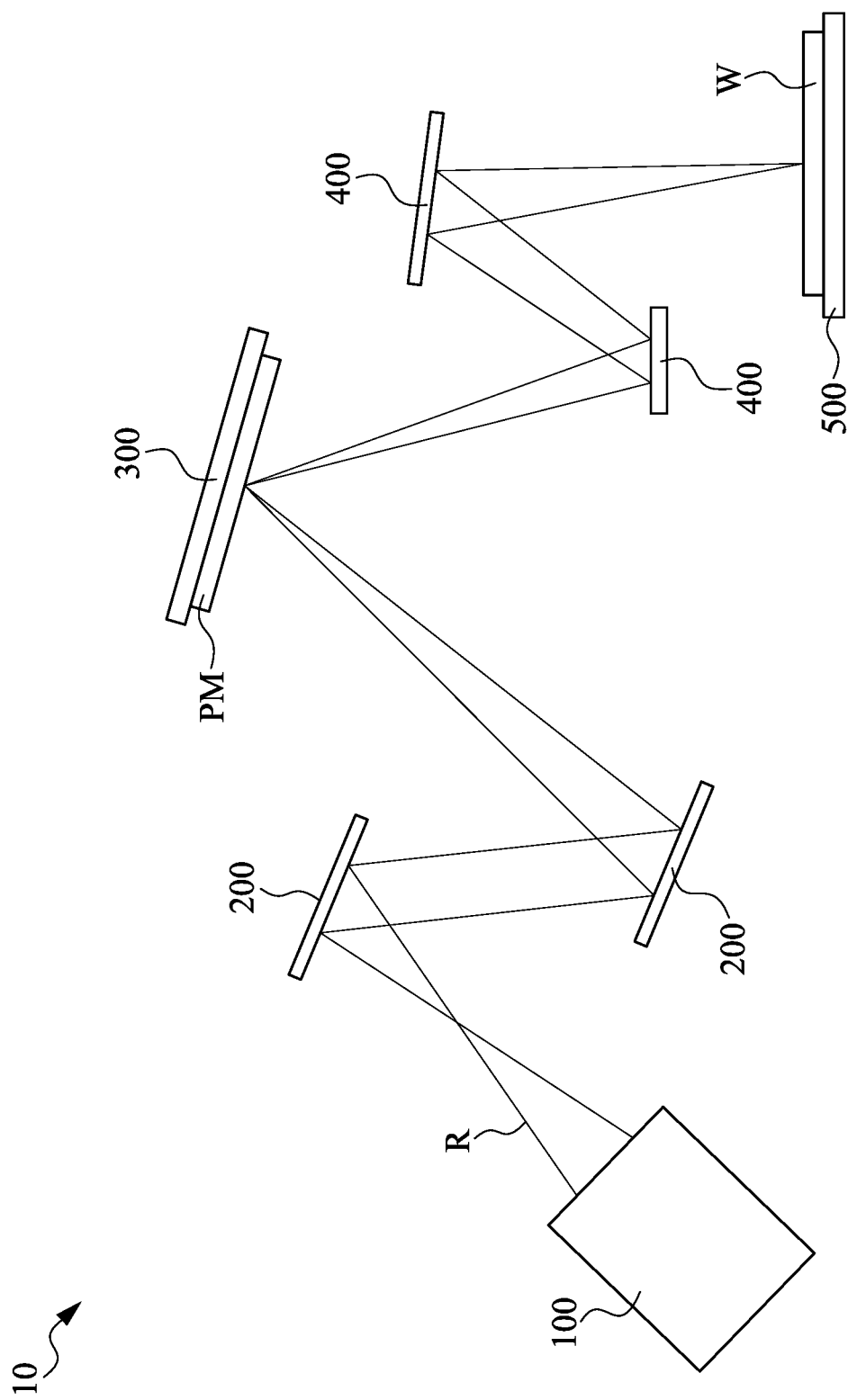
FIG. 1 is a schematic view of an EUV lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Electromagnetic radiation, e.g., extreme ultraviolet light having wavelengths of around 50 nm or less (also sometimes referred to as soft x-rays), and including light at a wavelength of about 13.5 nm, can be used in photolithography processes to produce extremely small features in substrates such as silicon wafers. Here and elsewhere herein the term light will be used even though it is understood that the radiation described using that term may not in the visible part of the spectrum.

Methods for generating EUV light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma can be produced by using a laser beam to irradiate a target material having the required line-emitting element.

The target material may take many forms. It may be solid or a molten. If molten, it may be dispensed in several different ways such as in a continuous stream or as a stream of discrete droplets. As an example, the target material in much of the discussion which follows is molten tin which is dispensed as a stream of discrete droplets.

The stream of droplets is generated by a droplet generator. However, if the target material includes impurities, such as Tin oxide, the impurities may damage the nozzle of the droplet generator and thus causes y-jump and/or no droplet issue.

FIG. 1 is a schematic view of an EUV lithography system 10 according to aspects of the present disclosure. The EUV lithography system 10 may be referred to as a scanner that is operable to perform lithographic processes including exposure. In some embodiments, the lithography processes are performed using EUV radiation R. In some embodiments, the EUV lithography system 10 includes an EUV light source module 100, which is configured to generate the EUV radiation R. In some embodiments of the present disclosure, the EUV radiation R may have a wavelength between about 1 nm and about 100 nm, and particularly, about 13.5 nm. The EUV lithography system 10 employs an EUV photomask PM, as mentioned above, to reflect the EUV radiation R. Hence, the circuitry pattern on the EUV photomask PM may be precisely duplicated onto a target wafer W by exposing a photoresist on the target wafer W to the EUV radiation R.

In some embodiments, the EUV lithography system 10 includes an illuminator 200. The illuminator 200 includes a variety of optic components, such as a refractive optics system having multiple lenses and/or a reflective optics system having multiple mirrors, so as to direct the EUV radiation R from the EUV light source module 100 toward a mask stage 300, on which the EUV photomask PM is held. Additionally, the mask stage 300 is configured to secure the EUV photomask PM. In some embodiments, the mask stage 300 is an electrostatic chuck (also known as an S-chuck or an R-chuck), which may hold the EUV photomask PM through an attraction force therebetween. Since even a gas molecule may absorb the EUV radiation R and reduce its intensity, the EUV lithography system 10 is designed to be positioned in a vacuum environment to avoid intensity loss of the EUV radiation R. The electrostatic chuck utilizes only the attraction force to hold the EUV photomask PM, such that the use of the electrostatic chuck does not result in presence of particles or gas molecules.

In the disclosure, the terms mask, photomask, and reticle are used to refer to the same item. The EUV photomask PM includes a substrate with a suitable material, such as a low thermal expansion material (LTEM) or fused quartz. The LTEM may include $TiO_2$ doped $SiO_2$, or other suitable materials with low thermal expansion. The EUV photomask PM includes multiple reflective multi layers (ML) deposited on the substrate. The ML includes a plurality of film pairs, such as molybdenum-silicon (Mo/Si) film pairs (e.g., a layer of molybdenum above or below a layer of silicon in each film pair). In some embodiments, the ML may include molybdenum-beryllium (Mo/Be) film pairs, or other suitable materials that are configurable to efficiently reflect the EUV light. The EUV photomask PM may further include a capping layer, such as ruthenium (Ru), disposed on the ML for protection. The EUV photomask PM further includes an absorption layer, such as a tantalum boron nitride (TaBN) layer, deposited over the ML. The absorption layer is patterned to define a pattern of a layer of an integrated circuit (IC). Alternatively, another reflective layer may be deposited over the ML and is patterned to define a pattern of layer of an integrated circuit, thereby forming an EUV phase shift mask.

In some embodiments, the EUV lithography system 10 includes a projection optics module 400 (also known as a projection optics box (POB)). The projection optics module 400 is configured to transfer the circuitry pattern of the EUV photomask PM onto the target wafer W, secured by a wafer stage 500, after the EUV radiation R is reflected by the EUV photomask PM. The projection optics module 400 includes a variety of refractive optics and/or reflective optics arranged based on various designs. The EUV radiation R, which is reflected by the EUV photomask 100 and carries the circuitry pattern defined on the EUV photomask PM is directed toward the target wafer W by the projection optics module 400. Hence, due to the configurations of the illuminator 200 and the projection optics module 400, the EUV radiation R may be focused on the EUV photomask PM and the target wafer W with suitable traits, such as intensity and clearness.

Figure 2:
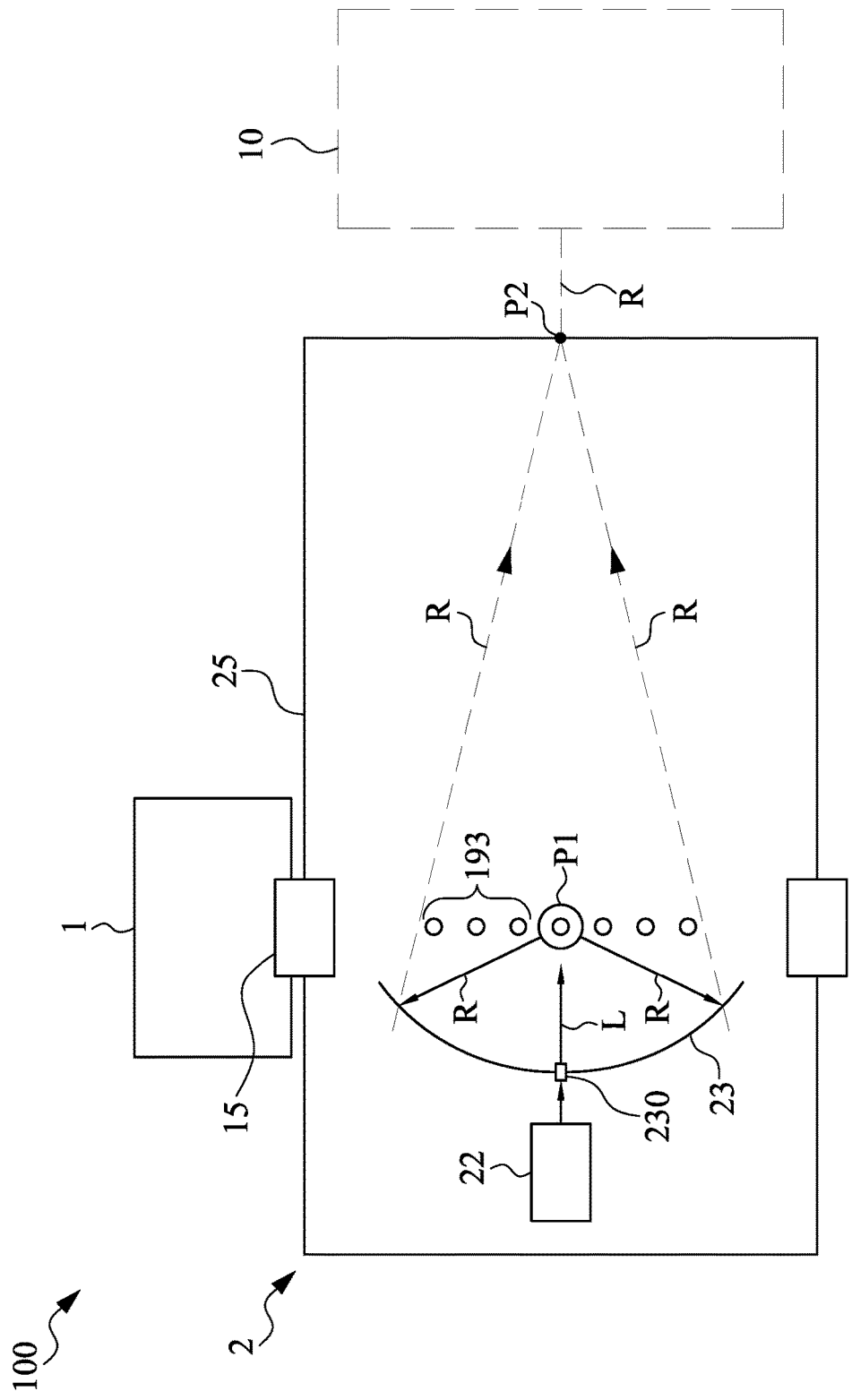
FIG. 2 is a schematic view of an EUV light source module in accordance with some embodiments of the present disclosure.

FIG. 2 is a schematic view of an EUV light source module 100 in accordance with some embodiments of the present disclosure. In some embodiments of the present disclosure, the EUV light source module 100 includes a target material supply system 1 and an EUV light source 2.

The target material supply system 1 is configured to supply the fluid target material in the form of a stream of targets for use by the EUV light source 2. The fluid target material is a target material that is in a fluid state (such as a liquid state). In some embodiments of the present disclosure, the target material supply system 1 include a droplet generator assembly 15 configured to produce droplets of the target material.

The EUV light source 2 includes a laser light source 22, a condenser 23, a target material droplets collector 25 and a light source chamber 25 configured to receive the above elements. Generally, in the process of generating extreme ultraviolet light, the light source chamber 25 is kept in a vacuum state such that the extreme ultraviolet light will not be absorbed by other substances and the output power of the EUV light source 2 will not be decreased.

The droplet generator assembly 15 of the target supply system 1 is configured to generate a plurality of target droplets 120 in the EUV light source 2. In some embodiments of the present disclosure, the target droplets 193 are Sn droplets. The target droplets 193 may have at least one material among a group including tin (Sn), tin containing liquid material such as eutectic tin alloy, lithium (Li), xenon (Xe), combinations thereof, and the like. In some embodiments, the target droplet 193 may have a diameter of about 30 microns (µm), but the disclosure is not limited thereto. In some embodiments, the target droplets 193 are generated one at a time with substantially the same period between two consecutive target droplets 193.

In some embodiments of the present disclosure, the target droplets 193 generated by the droplet generator assembly 15 are arranged in a straight line and emitted into an excitation zone P1 in the light source chamber 25 (as shown in FIG. 2). However, if the target material includes impurities, the impurities of the target material may damage the nozzle of the droplet generator assembly 15 and thus the droplet generator assembly 15 may not generate the target droplet 193 and/or the target droplet 193 may not be accurately emitted into the excitation zone P1 in the light source chamber 25.

The laser light source 22 is configured to generate a laser beam L which can be received by the target droplet 193. In some embodiments of the present disclosure, the laser light source 22 is a carbon dioxide ($CO_2$) laser light source or other optional types of laser light sources. In addition, the laser beam L generated by the laser light source 22 can be emitted to the target droplet 193 located in the excitation region P1 through a beam delivery system (not shown) and a focusing element (not shown). The position of the excitation region P1 is located on the focal point of the above-mentioned focusing element. In some embodiments of the present disclosure, the condenser 23 is provided with a window 230 (as shown in FIG. 2) that allows the laser beam L to pass through and reach to the excitation region P1. When the laser beam L emitted from the laser light source 22 hits the target droplet 193 located in the excitation zone P1, the laser light source 22 can heat the target droplet 193 to a critical temperature, so that the target droplet 193 generates highly ionized plasma. Furthermore, the highly ionized plasma emits EUV radiation R with a wavelength of about 13.5 nanometers.

The condenser 23 is configured to have an appropriate coating and shape to collect, reflect and focus the extreme ultraviolet light. In some embodiments of the present disclosure, the condenser 23 has an elliptical geometric shape, and the elliptical condenser 23 has a first focus in the excitation region P1. In some embodiments of the present disclosure, the coating material of the condenser 23 includes one multilayer (for example, a plurality of molybdenum-silicon film pairs) and further includes a covering layer (such as a ruthenium layer) coated on the multilayer so as to reflect the extreme ultraviolet light. During the lithography exposure process, the condenser 23 may collect and reflect the EUV radiation R emitted by the plasma, and focus it on one of the second focal points P2 (also called the intermediate focus) of the elliptical condenser 123. From there, the EUV radiation R may be transmitted to an EUV lithography system 10 as mentioned above. Thus, the EUV lithography system 10 employs the EUV photomask PM to reflect the EUV radiation R, and the circuitry pattern on the EUV photomask PM may be precisely duplicated onto a target wafer W.

The target droplet collector 24 is configured to collect the excessive target droplets 193 that are not used to form the EUV radiation R. In some embodiments of the present disclosure, in the light source chamber 25, the target droplet collector 24 is disposed opposite to the droplet generator assembly 15 to collect the excessive target droplet 193.

Figure 3:
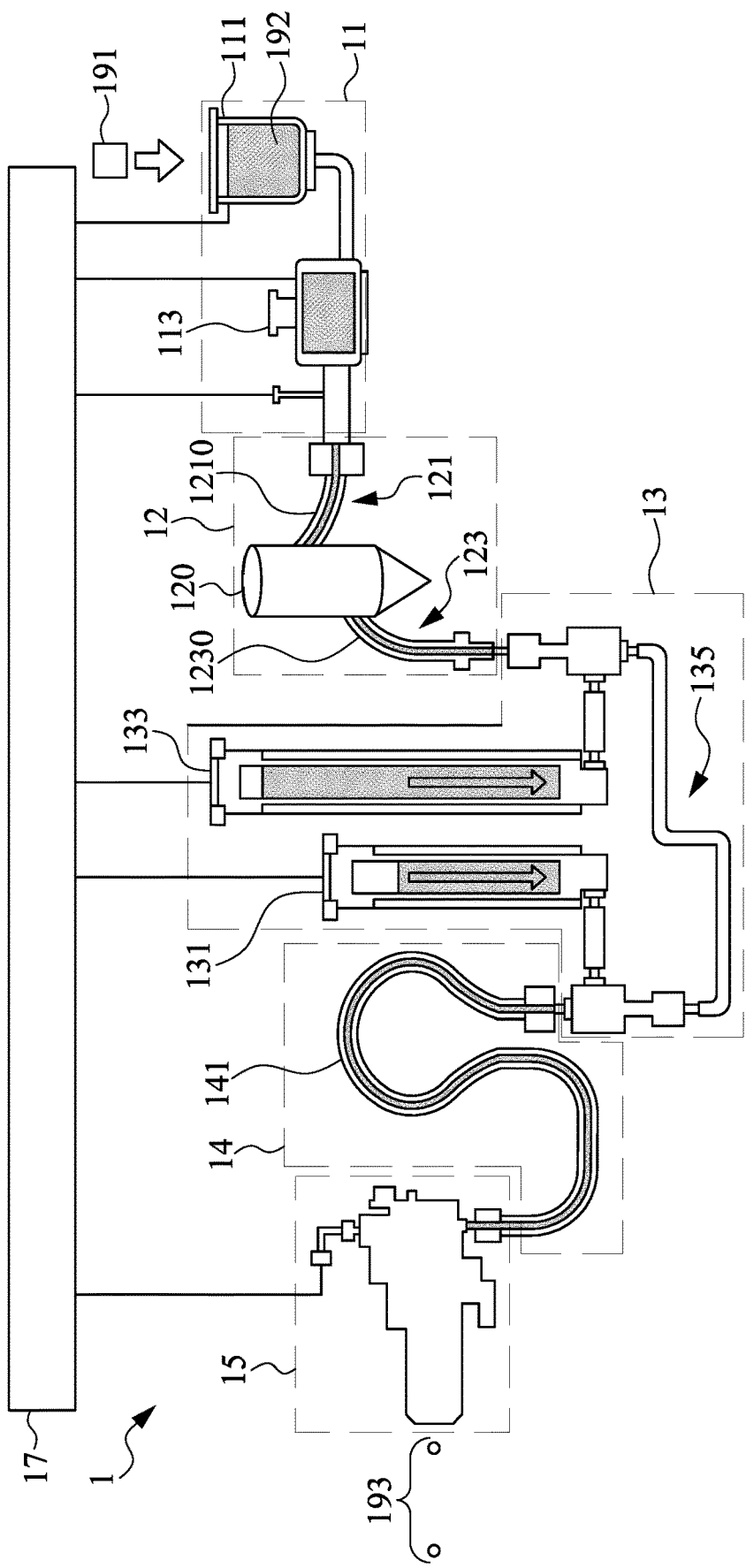
FIG. 3 is a schematic view of a target material supply system in accordance with some embodiments of the present disclosure.

FIG. 3 is a schematic view of a target material supply system 1 in accordance with some embodiments of the present disclosure.

The target material supply system 1 may include a priming assembly 11, a refill assembly 12, a storage assembly 13, a transfer assembly 14, the droplet generator assembly 15 and an environment control apparatus 17.

In some embodiments of the present disclosure, the priming assembly 11 includes a heating tank 111 and a storage tank 113. The heating tank 111 is configured to receive a solid matter 191 that includes the target material and transform the solid matter 191 to the fluid target material 192. In some embodiments of the present disclosure, the heating tank 111 is configured to heat the solid matter 191 so as to melt the solid matter 191 into the fluid target material 192. Further, the fluid target material 192 is delivered into the storage tank 113.

In some embodiments of the present disclosure, the solid matter 191 is an ingot (such as a block or disk) made mostly of tin. The ingot can be at least 99% (or at least 99.9%) by weight pure. This means that there could be trace amounts of other non-tin material (such as lead and antimony) that could be present in the solid matter 191. If the solid matter 191 is a tin ingot, the heating tank 111 may include a device or devices that heat the solid matter 191 to a temperature above 450° F. (which is the melting point of tin). When melted, the solid tin turns into liquid tin and other non-tin material (such as the lead and antimony, or molecules or other components). The non-tin material can include one or more molecules, atoms, compounds, or other components, each of which is in the solid or liquid state, depending on the melting point of that component. The liquid tin (in this case, becomes the fluid target material 192) is therefore supplied to the storage tank 113.

Since the heating tank 111 may be opened so that the solid matter 191 could be added into the heating tank 111, the outside air and moisture may flow into the heating tank 111 and contact the solid matter 191 and/or the fluid target material 192 in the heating tank 111. Thus, the fluid target material 192 may include oxides, such as the $SnO_x$, due to the oxidation. Further, the oxides may become impurities in the fluid target material 192.

The refill assembly 12 is connected to the priming assembly 11 and in fluid communication with the priming assembly 11. In some embodiments of the present disclosure, the refill assembly 12 include fluid communication apparatus 121, 123 and a purifier 120. In some embodiments of the present disclosure, the fluid communication apparatus 121, 123 includes fluid transmission lines 1210, 1230 and one or more regulation devices configured to regulate, direct, or control the flow of a fluid through the fluid transmission lines 1210, 1230. The fluid communication apparatus 121 is in fluid communication with the storage tank 113 of the priming assembly 11 and the purifier 120 and configured to transfer the fluid target material 192 from the storage tank 113 into the purifier 120. The fluid communication apparatus 121 is in fluid communication with the purifier 120 and configured to transfer the fluid target material 192 from the purifier. The purifier 120 is configured to purify the fluid target material 192 from the storage tank 113 of the priming assembly 11. As above mentioned, the fluid target material 192 may include impurities since the outside air and moisture flowing into the priming assembly 11 cause the solid matter 191 and/or the fluid target material 192 generate the oxide. The purifier 120 is configured to separate the impurities, such as tin oxide, from the fluid target material 192 such that the fluid target material 192 flowing into the fluid communication 123 may not have the impurities.

The storage assembly 13 is in fluid communication with the fluid communication 123 and configured to receive and storage the fluid target material 192 which has been purified.

In some embodiments of the present disclosure, the storage assembly 13 includes a priming reservoir 131 and a refill reservoir 133. The priming reservoir 131 is configured to contain the fluid target material 192 and be in continuous fluid communication with the droplet generator assembly 15 during operation of the droplet generator assembly 15. The priming reservoir 131 is a volume that is defined by a structure that can be formed, lined, or reinforced with material that remains stable and solid above the melting point of the fluid target material 192 and is also not chemically reactive with the fluid target material 192. The first fluid reservoir 112 is in fluid communication with the droplet generator assembly 15 via the transfer assembly 14.

The refill reservoir 133 is configured to contain the fluid target material 192 and be in fluid communication with the priming reservoir system 131 for at least part of the time during operation of the droplet generator assembly 15. The refill reservoir 133 is a volume that is defined by a structure that can be formed, lined, or reinforced with material that remains stable and solid above the melting point of the fluid target material 192 and is also not chemically reactive with the fluid target material 192.

In some embodiments of the present disclosure, the volume within the structure of the refill reservoir 133 is the same size as the volume within the structure of the priming reservoir 131 so that the priming reservoir 131 and the refill reservoir 133 can hold/retain the same amount of fluid target material 192. In some embodiments of the present disclosure, the volume within the structure of the refill reservoir 133 can be greater than the volume within the structure of the priming reservoir 131. That is, the refill reservoir 133 would be able to hold/retain a larger amount of fluid target material 192 than the priming reservoir 131.

Referring to FIG. 3, the environment control apparatus 17 is fluidly connected to the priming reservoir 131 and the refill reservoir 133 of the storage assembly 13. The environment control apparatus 17 is configured to provide a special gas into the priming reservoir 131 and the refill reservoir 133 such that the priming reservoir 131 and the refill reservoir 133 are kept in vacuum. That is, the fluid target material 192 is transferred into a vacuum environment and stored in a vacuum environment after the fluid target material 192 is purified by the purifier 120.

In some embodiments of the present disclosure, the environment control apparatus 17 is configured to independently control an environment (such as a temperature and a pressure) of each of the priming reservoir 131 and the refill reservoir 133. The priming reservoir 131 is maintained at a first pressure Pi, which, in some implementations, is adjustable by the environment control apparatus 17 during operation of the droplet generator assembly 15. At some times during operation, the first pressure Pi may be at least 4000 Psi. During operation of the droplet generator assembly 15, and when the priming reservoir 131 is supplying the fluid target material 192 to the droplet generator assembly 15, the first pressure Pi may be any suitable pressure that is greater than a pressure within the droplet generator assembly 15.

The refill reservoir 133 is maintained at a second pressure Pii, which can be adjustable by the environment control apparatus 17 during operation of the droplet generator assembly 15. The value of the second pressure Pii at any one moment can depend on the current operation of the system 1. At some times, the second pressure Pii of the refill reservoir 113 can be the same as a pressure Pi at which the priming assembly 11 is maintained. At other times, the second pressure Pi of the refill reservoir 133 can be the same as the first pressure Pi at which the priming reservoir 131 is maintained.

The storage assembly 13 may further include a fluid communication apparatus 135. In some embodiments of the present disclosure, the fluid communication apparatus 135 includes fluid transmission lines and one or more regulation devices configured to regulate, direct, or control the flow of a fluid through the fluid transmission lines. The priming reservoir 131 and the refill reservoir 133 may be in fluid communication with each other through the fluid communication apparatus 135. In addition, the fluid communication apparatus 135 may be used as a bypass such that the fluid target material 192 is transferred from the refill assembly 12 to the transfer assembly 14 directly and bypasses the priming reservoir 131 and/or the refill reservoir 133.

The transfer assembly 14 may be connected to the refill assembly 12 and the storage assembly 13. As shown in FIG. 3, the transfer assembly 14 may be in fluid communication with the fluid communication apparatus 123 of the refill assembly 12 and the priming reservoir 131 and/or the refill reservoir 133 of the storage assembly 13. In some embodiments of the present disclosure, the transfer assembly 14 includes a fluid transmission line 141 and one or more regulation devices configured to regulate, direct, or control the flow of a fluid through the fluid transmission line 141.

As mentioned above, the droplet generator assembly 15 is configured to supply the fluid target material 192 in the form of a stream of target droplet 193 for use by the EUV source 2.

As mentioned above, the environment control apparatus 17 is configured to independently control the temperatures and the pressures of each of the priming reservoir 131 and the refill reservoir 133 of the storage assembly 13. The environment control apparatus 17 is configured to independently and separately control the first pressure Pi of the priming reservoir 131 and the second pressure Pi of the refill reservoir 133. The environment control apparatus 17 is configured to independently control a temperature and a pressure of one or more aspects of the heating tank 111 and the storage tank 113 of the priming assembly 11 and the droplet generator assembly 15.

The environment control apparatus 17 may include a plurality of components each configured to independently and separately control either the temperature or the pressure of either of the priming reservoir 131 and the refill reservoir 133. The environment control apparatus 17 may include a component to control the first pressure Pi of the priming reservoir 131 and a component to control the second pressure Pii of the refill reservoir 133. Each of the components that independently and separately control the first pressure Pi of the priming reservoir 131 and the second pressure PH of the refill reservoir 133 can be a pressure control component that is in fluid communication with the priming reservoir 131 or the refill reservoir 133, respectively. In some embodiments of the present disclosure, a pressuring gas can be applied to each of the cavities of the priming reservoir 131 and the refill reservoir 133, and by adjusting the pressure of the respective pressuring gas, the respective first pressure Pi and second pressure Pii can be adjusted. A pressuring gas that is inert or non-reactive with the fluid target material 192 should be used. The pressuring gas may be a mixture of hydrogen and argon, such as a mixture of 2% hydrogen in argon.

Figure 4:
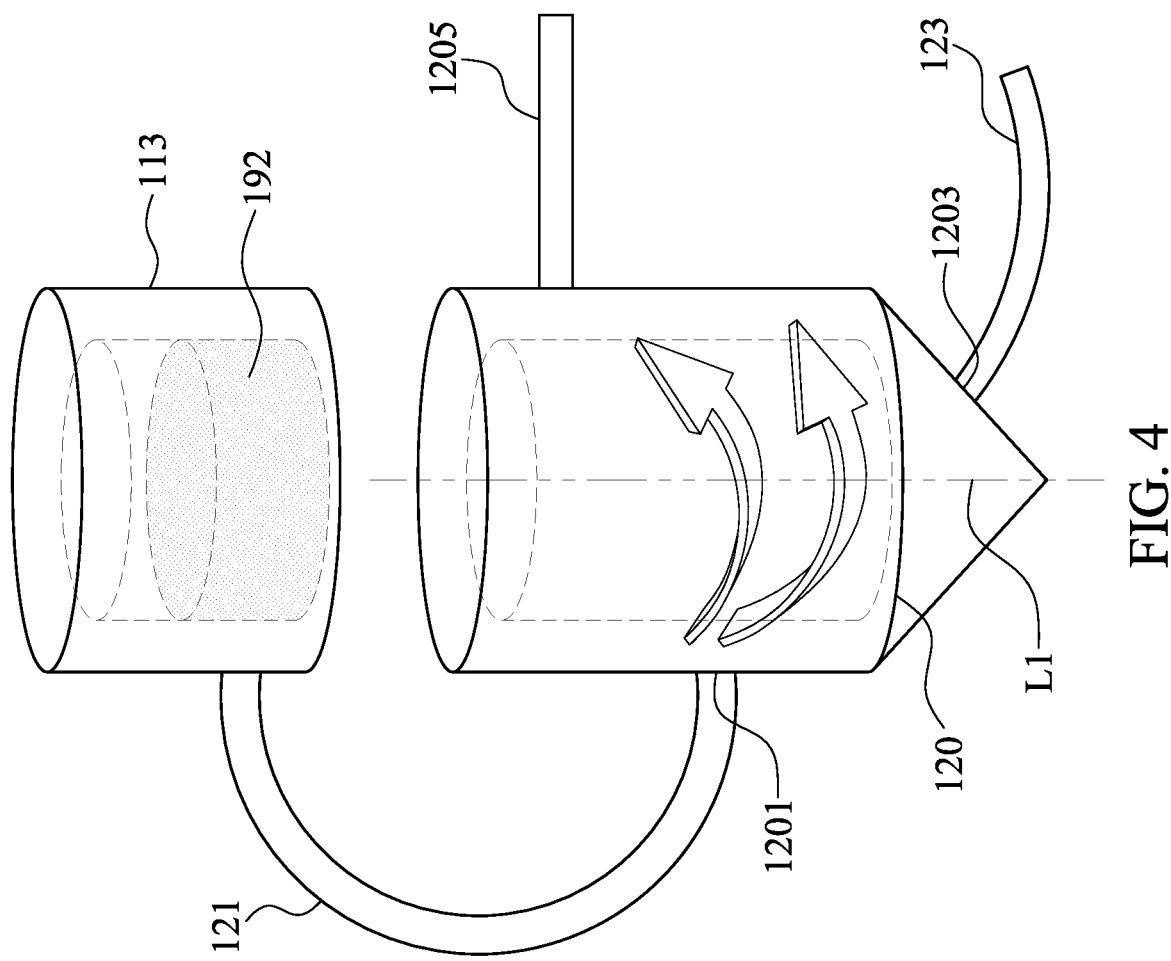
FIG. 4 is a schematic view of a purifier in accordance with some embodiments of the present disclosure.

FIG. 4 is a schematic view of a purifier 120 in accordance with some embodiments of the present disclosure. In some embodiments of the present disclosure, the purifier 120 includes a centrifuge. As shown in FIG. 3, the fluid communication apparatus 121 in fluid communication with the storage tank 113 is connected to the purifier 120 and the fluid communication apparatus 123 is connected to the purifier 120 as well. The fluid communication apparatus 121 is configured to transfer the fluid target material 192 from the storage tank 113 to the purifier 120. As mentioned above, the fluid target material 192 may include oxides, due to the oxidation in the heating tank 111, and thus the fluid target material 192 may include impurities. The centrifuge of the purifier 120 uses centrifugal force to separate the impurities from the fluid target material 192. The centrifuge of the purifier 120 may spin the fluid target material 192 at a high speed, thereby separating the impurities from the fluid target material 192. The centrifugal force produced by the centrifuge of the purifier 120 causes the impurities to move outward in the radial direction and causes the pure fluid target material 192 to move to the center. Thus, an outlet 1203, which is used for discharging the purified fluid target material 192 into the fluid communication apparatus 123, is positioned to be close to a rotation axis L1 of the purifier 120 and close to a bottom of the purifier 120, and an outlet 1205, which is used for discharging the impurities separated from the fluid target material 192, is arranged at the periphery of the purifier 120 and above the outlet 1203. Further, an inlet 1201 connected to the fluid communication apparatus 120 is positioned at the periphery of the purifier 120 and above the outlet 1203 connected to the fluid communication apparatus 123.

In addition, the centrifuge of the purifier 120 is used to receive and spin the fluid target material 192, and thus the centrifuge of the purifier 120 is high-temperature-resistant. Therefore, the purifier 120 is defined by a structure that can be formed, lined, or reinforced with material that remains stable and solid above the melting point of the fluid target material 192 and is also not chemically reactive with the fluid target material 192.

Figure 5:
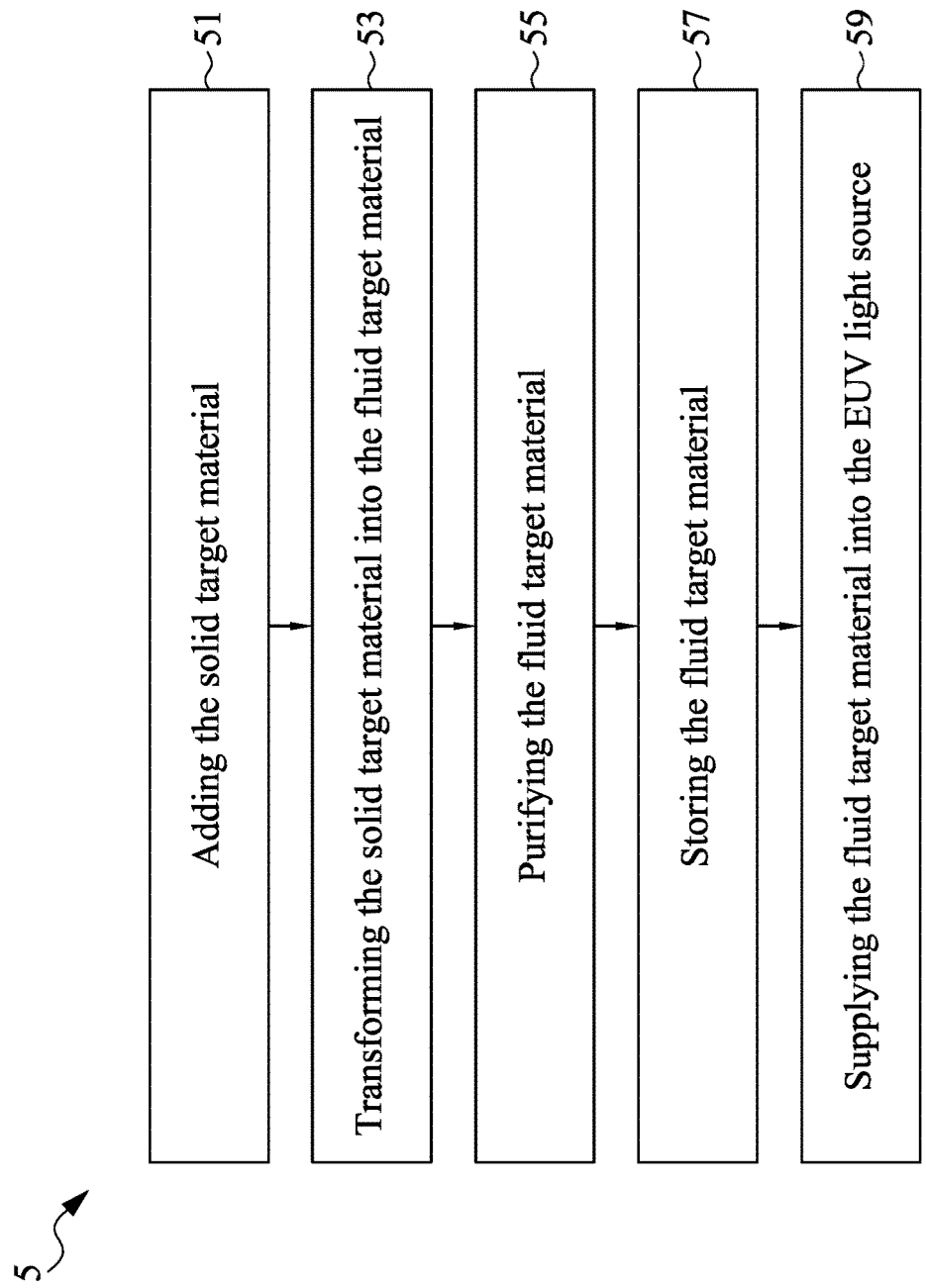
FIG. 5 is a flow chart representing exemplary operations of the method for supplying a target material, in accordance with some embodiments of the present disclosure.

FIG. 5 is a flow chart representing exemplary operations of the method 5 for supplying a target material, in accordance with some embodiments of the present disclosure.

In operation 51, the solid matter 191 that includes the target material is added into the heating tank 111 of the priming assembly 11. In some embodiments of the present disclosure, the solid matter 191 is an ingot (such as a block or disk) made mostly of tin. The ingot can be at least 99% (or at least 99.9%) by weight pure.

In operation 53, the solid matter 191 including the target material is transformed to the fluid target material 192. In some embodiments of the present disclosure, the heating tank 111 is configured to heat the solid matter 191 so as to melt the solid matter 191 into the fluid target material 192. Further, the fluid target material 192 is delivered into the storage tank 113 of the priming assembly. In addition, the fluid target material may have the oxide since the solid matter 191 and/or the fluid target material 192 may contact the outside air and/or moisture during the process of adding the solid matter 191 into the heating tank 111 and/or the process of transforming the solid matter 191 to the fluid target material 192. The environment control apparatus 17 may control the interior environment of the heating tank 111 such that the solid matter 191 is melting while in a vacuum environment within the heating tank 111 to reduce oxidation within the fluid target material 192. However, the fluid target material 192 may still have the oxide. Thus, the fluid target material 192 may include the impurities.

In operation 55, the fluid target material 192 is transferred into the purifier 120 to be purified. The fluid target material 192 is transferred from the storage tank 113 of the priming assembly into the purifier 120. In some embodiments of the present disclosure, the purifier 120 includes the centrifuge which is configured to use centrifugal force to separate the impurities from the fluid target material 192. After purifying the fluid target material 192, the pure fluid target material 192 without the impurity is discharged out of the purifier 120.

In operation 57, the fluid target material 192 is transferred into the storage assembly 13 after the fluid target material 192 is purified by the purify 120. In some embodiments of the present disclosure, the storage assembly 13 includes a priming reservoir 131 and a refill reservoir 133. The priming reservoir 131 is configured to contain the fluid target material 192 and be in continuous fluid communication with the droplet generator assembly 15 during operation of the droplet generator assembly 15, and the refill reservoir 133 is configured to contain the fluid target material 192 and be in fluid communication with the priming reservoir system 131 for at least part of the time during operation of the droplet generator assembly 15. The environment control apparatus 17 may provide the special gas into the priming reservoir 131 and the refill reservoir 133 of the storage assembly 13 such that the priming reservoir 131 and the refill reservoir 133 may be substantially kept in vacuum. That is, the fluid target material 192 is transferred into and/or stored in a vacuum environment after the fluid target material 192 is purified.

In operation 59, the fluid target material 192 is transferred from the storage assembly 13 into the droplet generator assembly 15 through the transfer assembly 14. The droplet generator assembly 15 receives the fluid target material 192 and generate the target droplet 193 and then supplies the target droplet 193 into the EUV light source 1.

It will be further appreciated that the foregoing system and method may be used for purifying the target material which is supplied into the EUV light source. The supply system includes the purifier which is configured to separate the impurities from the fluid target material. Thus, the fluid target material may not have the impurities which may damage the nozzle of the droplet generator assembly and thus the target droplet can be continuously and accurately emitted into the excitation zone in the light source chamber of the EUV light source.

According to some embodiments of the present disclosure, a system for supplying a target material comprises a priming assembly, a refill assembly and a droplet generator assembly. The priming is configured to transform the target material from a solid state to a liquid state. The refill assembly is in fluid communication with the priming assembly and configured to receive the target material in the liquid state from the priming assembly. Further, the refill assembly includes a purifier configured to purify the target material in the liquid state. The droplet generator assembly is configured to supply the target material in the liquid state from the refill assembly.

According to some other embodiments of the present disclosure, a system for supplying a target material comprises a first portion configured to be filled with the target material, a second portion in fluid communication with the first portion and configured to receive and purify the target material transferred from the first portion, and a third portion in fluid communication with the second portion and configured to receive and supply the target material transferred from the second portion.

According to still some other embodiments of the present disclosure, a method for supplying a target material, comprises: adding a solid target material, transforming the solid target material to a fluid target material, purifying the fluid target material, and supplying the fluid target material into an EUV light source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for supplying a target material, comprising
a priming assembly configured to transform the target material from a solid state to a liquid state;
a refill assembly in fluid communication with the priming assembly and configured to receive the target material in the liquid state from the priming assembly, wherein the refill assembly has a purifier configured to purify the target material in the liquid state; and
a droplet generator assembly configured to supply the target material in the liquid state from the refill assembly.

2. The system of claim 1, wherein the purifier comprises a centrifuge configured to separate an impurity from the target material in the liquid state.

3. The system of claim 2, wherein the centrifuge comprises a material whose melting point is higher than a melting point of the target material.

4. The system of claim 1, further comprising a storage assembly in fluid communication with the refill assembly and configured to receive the target material from the refill assembly, wherein the storage assembly is substantially kept in vacuum.

5. The system of claim 4, wherein the droplet generator assembly is in fluid communication with the storage assembly.

6. The system of claim 5, further comprising a transfer assembly configured to connect the storage assembly and the droplet generator assembly and transfer the target material from the storage assembly to the droplet generator assembly.

7. The system of claim 4, wherein the storage assembly comprises a refill reservoir and a priming reservoir, which are in fluid communication with each other.

8. The system of claim 7, wherein the refill reservoir is configured to hold a larger amount of the target material than the priming reservoir.

9. A system for supplying a target material, comprising
 a first portion configured to be filled with the target material;
 a second portion in fluid communication with the first portion and configured to receive and purify the target material transferred from the first portion; and
 a third portion in fluid communication with the second portion and configured to receive and supply the target material transferred from the second portion.

10. The system of claim 9, wherein the second portion is configured to use centrifugal force to separate an impurity from the target material.

11. The system of claim 10, wherein the second portion comprises a first outlet and a second outlet, wherein the first outlet is configured to discharge the impurity, which is separated from the target material, out of the second portion, and wherein the second outlet is configured to discharge the target material, which has been purified, out of the second portion.

12. The system of claim 11, wherein the second outlet is closer to a rotation axis of the second portion than the first outlet is to the rotation axis of the second portion.

13. The system of claim 10, wherein the second portion comprises an inlet, which is configured to draw the target material from the first portion into the second portion, and an outlet, which is configured to discharge the purified fluid target material out of the second portion, and wherein the inlet is positioned above the outlet.

14. The system of claim 9, wherein the third portion is configured to supply the target material into an EUV light source.

15. The system of claim 14, wherein the EUV light source includes a laser light source and wherein the laser light source is configured to emit a laser beam to hit the target material so as to produce an EUV radiation.

16. The system of claim 15, wherein the EUV radiation is transmitted to an EUV lithography system which comprises an EUV photomask configured to reflect the EUV radiation and a target wafer configured to receive the EUV radiation reflected by the EUV photomask.

17. A method for supplying a target material, comprising:
 adding a solid target material;
 transforming the solid target material to a fluid target material;
 purifying the fluid target material; and
 supplying the fluid target material into an EUV light source.

18. The method of claim 17, wherein the fluid target material is purified by a centrifuge.

19. The method of claim 17, further comprising: storing the fluid target material after purifying the fluid target material.

20. The method of claim 19, wherein the fluid target material is stored in a vacuum environment.

\* \* \* \* \*